(12) United States Patent
Sokolov et al.

(10) Patent No.: US 8,001,320 B2
(45) Date of Patent: Aug. 16, 2011

(54) COMMAND INTERFACE FOR MEMORY DEVICES

(75) Inventors: Dotan Sokolov, Ra'anana (IL); Naftali Sommer, Rishon le-Zion (IL)

(73) Assignee: Anobit Technologies Ltd., Herzliya Pituach (IL)

( * ) Notice: Subject to any disclaimer, the term of this patent is extended or adjusted under 35 U.S.C. 154(b) by 645 days.

(21) Appl. No.: 12/045,520

(22) Filed: Mar. 10, 2008

(65) Prior Publication Data

US 2008/0263262 A1    Oct. 23, 2008

Related U.S. Application Data

(60) Provisional application No. 60/913,281, filed on Apr. 22, 2007, provisional application No. 60/917,653, filed on May 12, 2007.

(51) Int. Cl.
*G06F 12/00* (2006.01)

(52) U.S. Cl. .... 711/104; 711/105; 711/155; 365/185.01

(58) Field of Classification Search ........................ None
See application file for complete search history.

(56) References Cited

U.S. PATENT DOCUMENTS

| | | |
|---|---|---|
| 4,556,961 A | 12/1985 | Iwahashi et al. |
| 4,558,431 A | 12/1985 | Satoh |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrottra et al. |

(Continued)

FOREIGN PATENT DOCUMENTS

EP    0783754 B1    7/1997

(Continued)

OTHER PUBLICATIONS

Jedec Standard JESD84-C44, "Embedded MultiMediaCard (e•MMC) Mechanical Standard, with Optional Reset Signal", Jedec Solid State Technology Association, USA, Jul. 2009.

(Continued)

*Primary Examiner* — Than Nguyen
(74) *Attorney, Agent, or Firm* — D. Kligler I.P. Services Ltd.

(57) ABSTRACT

A method for operating a memory device that includes a plurality of analog memory cells includes accepting at an input of the memory device a self-contained command to perform a memory access operation on at least one of the memory cells. The command includes an instruction specifying the memory access operation and one or more parameters that are indicative of analog settings to be applied to the at least one of the memory cells when performing the memory access operation. The self-contained command is executed in the memory device by extracting the parameters, applying the analog settings to the at least one of the memory cells responsively to the extracted parameters, and performing the specified memory access operation in accordance with the instruction on the at least one of the memory cells using the settings.

36 Claims, 2 Drawing Sheets

U.S. PATENT DOCUMENTS

| | | |
|---|---|---|
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,416,782 A | 5/1995 | Wells et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,541,886 A | 7/1996 | Hasbun |
| 5,600,677 A | 2/1997 | Citta et al. |
| 5,657,332 A | 8/1997 | Auclair et al. |
| 5,657,332 A | 8/1997 | Auclair |
| 5,675,540 A | 10/1997 | Roohparvar |
| 5,682,352 A | 10/1997 | Wong et al. |
| 5,696,717 A | 12/1997 | Koh |
| 5,726,649 A | 3/1998 | Tamaru et al. |
| 5,742,752 A | 4/1998 | De Koning |
| 5,751,637 A | 5/1998 | Chen et al. |
| 5,761,402 A | 6/1998 | Kaneda et al. |
| 5,798,966 A | 8/1998 | Keeney |
| 5,801,985 A * | 9/1998 | Roohparvar et al. .... 365/185.01 |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,429 A | 2/1999 | Chen et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,969,986 A | 10/1999 | Wong et al. |
| 5,991,517 A | 11/1999 | Harari et al. |
| 5,995,417 A | 11/1999 | Chen et al. |
| 6,009,014 A | 12/1999 | Hollmer et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,166,962 A | 12/2000 | Chen et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,275,419 B1 | 8/2001 | Guterman et al. |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,396,742 B1 | 5/2002 | Korsh et al. |
| 6,397,364 B1 | 5/2002 | Barkan |
| 6,405,323 B1 | 6/2002 | Lin et al. |
| 6,418,060 B1 | 7/2002 | Yong et al. |
| 6,442,585 B1 | 8/2002 | Dean et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,558,967 B1 | 5/2003 | Wong |
| 6,560,152 B1 | 5/2003 | Cernea |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzalez et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,687,155 B2 | 2/2004 | Nagasue |
| 6,707,748 B2 | 3/2004 | Lin et al. |
| 6,708,257 B2 | 3/2004 | Bao |
| 6,717,847 B2 | 4/2004 | Chen |
| 6,731,557 B2 | 5/2004 | Beretta |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,807,095 B2 | 10/2004 | Chen et al. |
| 6,809,964 B2 | 10/2004 | Moschopoulos et al. |
| 6,829,167 B2 | 12/2004 | Tu et al. |
| 6,845,052 B1 | 1/2005 | Ho et al. |
| 6,851,018 B2 * | 2/2005 | Wyatt et al. .................. 711/111 |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,894,926 B2 | 5/2005 | Guterman et al. |
| 6,907,497 B2 | 6/2005 | Hosono et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 7,002,843 B2 | 2/2006 | Guterman et al. |
| 7,012,835 B2 | 3/2006 | Gonzales et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B2 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,151,692 B2 | 12/2006 | Wu |
| 7,170,802 B2 | 1/2007 | Cernea et al. |
| 7,173,859 B2 | 2/2007 | Hemink |
| 7,177,184 B2 | 2/2007 | Chen |

| Patent No. | Date | Inventor |
|---|---|---|
| 7,177,195 B2 | 2/2007 | Gonzales et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,928 B2 | 3/2007 | Chen |
| 7,197,594 B2 | 3/2007 | Raz et al. |
| 7,200,062 B2 | 4/2007 | Kinsely et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,257,027 B2 | 8/2007 | Park |
| 7,259,987 B2 | 8/2007 | Chen et al. |
| 7,266,026 B2 | 9/2007 | Gongwer et al. |
| 7,274,611 B2 | 9/2007 | Roohparvar |
| 7,277,355 B2 | 10/2007 | Tanzawa |
| 7,280,398 B1 | 10/2007 | Lee et al. |
| 7,280,409 B2 | 10/2007 | Misumi et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,272 B1 | 12/2007 | Mokhlesi et al. |
| 7,310,347 B2 | 12/2007 | Lasser |
| 7,321,509 B2 | 1/2008 | Chen et al. |
| 7,342,831 B2 | 3/2008 | Mokhlesi et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,388,781 B2 | 6/2008 | Litsyn et al. |
| 7,397,697 B2 | 7/2008 | So et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,420,847 B2 | 9/2008 | Li |
| 7,433,231 B2 | 10/2008 | Aritome |
| 7,437,498 B2 | 10/2008 | Ronen |
| 7,440,324 B2 | 10/2008 | Mokhlesi |
| 7,441,067 B2 | 10/2008 | Gorobetz et al. |
| 7,453,737 B2 | 11/2008 | Ha |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,471,581 B2 | 12/2008 | Tran et al. |
| 7,492,641 B2 | 2/2009 | Hosono et al. |
| 7,508,710 B2 | 3/2009 | Mokhlesi |
| 7,539,062 B2 | 5/2009 | Doyle |
| 7,551,492 B2 | 6/2009 | Kim |
| 7,568,135 B2 | 7/2009 | Cornwell et al. |
| 7,570,520 B2 | 8/2009 | Kamei et al. |
| 7,593,259 B2 | 9/2009 | Kim |
| 7,596,707 B1 | 9/2009 | Vemula |
| 7,631,245 B2 | 12/2009 | Lasser |
| 7,633,798 B2 | 12/2009 | Sarin et al. |
| 7,633,802 B2 | 12/2009 | Mokhlesi |
| 7,656,734 B2 | 2/2010 | Thorp et al. |
| 7,660,158 B2 | 2/2010 | Aritome |
| 7,660,183 B2 | 2/2010 | Ware et al. |
| 7,742,351 B2 | 6/2010 | Inoue et al. |
| 7,761,624 B2 | 7/2010 | Karamcheti et al. |
| 7,810,017 B2 | 10/2010 | Radke |
| 7,885,119 B2 | 2/2011 | Li |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0118574 A1 | 8/2002 | Gongwer et al. |
| 2002/0133684 A1 | 9/2002 | Anderson |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0086574 A1 | 4/2005 | Fackenthal |
| 2005/0121436 A1 | 6/2005 | Kamitani et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0028875 A1 | 2/2006 | Avraham et al. |
| 2006/0028877 A1 | 2/2006 | Meir |
| 2006/0101193 A1 | 5/2006 | Murin |
| 2006/0107136 A1 | 5/2006 | Gongwer et al. |
| 2006/0004952 A1 | 6/2006 | Lasser |
| 2006/0129750 A1 | 6/2006 | Lee et al. |
| 2006/0133141 A1 | 6/2006 | Gorobetz |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |

| | | |
|---|---|---|
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0282106 A1 | 11/2008 | Shalvi et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0204824 A1 | 8/2009 | Lin et al. |
| 2009/0204872 A1 | 8/2009 | Yu et al. |
| 2009/0225595 A1 | 9/2009 | Kim |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0110580 A1 | 5/2010 | Takashima |
| 2010/0142268 A1 | 6/2010 | Aritome |
| 2010/0142277 A1 | 6/2010 | Yang et al. |
| 2010/0169743 A1 | 7/2010 | Vogan et al. |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132456 A2 | 11/2007 |
| WO | 2007132458 A2 | 11/2007 |
| WO | WO-2007132453 | 11/2007 |
| WO | WO-2007132457 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |

OTHER PUBLICATIONS

Jedec, "UFS Specification", version 0.1, Nov. 11, 2009.

SD Group and SD Card Association, "SD Specifications Part 1 Physical Layer Specification", version 3.01, draft 1.00, Nov. 9, 2009.

Compaq et al., "Universal Serial Bus Specification", revision 2.0, Apr. 27, 2000.

Serial ATA International Organization, "Serial ATA Revision 3.0 Specification", Jun. 2, 2009.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

Eitan et al., "Can NROM, a 2-bit, Trapping Storage NVM Cell, Give a Real Challenge to Floating Gate Cells?" (1999).

Eitan et al., "Multilevel Flash Cells and Their Trade-Offs" (1996).

Maayan et al., "A 512Mb NROM Flash Data Storage Memory with 8MB/s Data Rate" (2002).

Bez et al., "Introduction to Flash Memory" (2003).

Kim et al., "Future Memory Technology including Emerging New Memories" (2004).

Agrell et al., "Closest Point Search in Lattices", IEEE Transactions on Information Theory, vol. 48, No. 8, pp. 2201-2214, Aug. 2002.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Engh et al., "A self adaptive programming method with 5 mV accuracy for multi-level storage in Flash", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Lee et al., "Effects of Floating Gate Interference on NAND Flash Memory Cell Operation", IEEE Electron Device Letters, vol. 23, No. 5, pp. 264-266, May 2002.

Mielke et al., "Recovery Effects in the Distributed Cycling of Flash Memories", IEEE 44th Annual International Reliability Physics Symposium, pp. 29-35, San Jose, USA, Mar. 2006.

ONFI, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

St Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{th}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

Sommer, N., U.S. Appl. No. 12/364,531 "Parameter Estimation Based on Error Correction Code Parity Check Equations" filed Feb. 3, 2009.

Perlmutter et al., U.S. Appl. No. 12/388,528 "Programming of Analog Memory Cells Using a Single Programming Pulse per State Transition" filed Feb. 19, 2009.

Perlmutter et al., U.S. Appl. No. 12/390,522 "Programming Analog Memory Cells for Reduced Variance After Retention" filed Feb. 23, 2009.

Perlmutter et al., U.S. Appl. No. 12/405,275 "Memory Device with Multiple-Accuracy Read Commands" filed Mar. 17, 2009.

Perlmutter et al., U.S. Appl. No. 12/397,368 "Efficient Readout from Analog Memory Cells Using Data Compression" filed Mar. 4, 2009.

Sommer, N., U.S. Appl. No. 12/171,797 "Memory Device with Non-Uniform Programming Levels" filed Jul. 11, 2008.

Shalvi et al., U.S. Appl. No. 12/251,471 "Compensation for Voltage Drifts in Analog Memory Cells" filed Oct. 15, 2008.

US 7,161,836, 1/2007, Wan et al. (withdrawn).

U.S. Appl. No. 12/019,011 Official Action dated Nov. 20, 2009.

Takeuchi et al., "A Multipage Cell Architecture for High-Speed Programming Multilevel Nand Flash Memories", IEEE Journal of Solid State Circuits, vol. 33, No. 8, Aug. 1998.

U.S. Appl. No. 11/949,135 Official Action dated Oct. 2, 2009.

Huffman, A., "Non-Volatile Memory Host Controller Interface (NVMHCI)", Specification 1.0, Apr. 14, 2008.

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.

U.S. Appl. No. 11/957,970 Official Action dated May 20, 2010.

Shalvi et al., U.S. Appl. No.12/822,207 "Adaptive Over-Provisioning in Memory Systems" filed on Jun. 24, 2010.

U.S. Appl. No. 12/251,471 Official Action dated Jan. 3, 2011.

Super User Forums, "SD Card Failure, can't read superblock", posted Aug. 8, 2010.

UBUNTU Forums, "Memory Stick Failed IO Superblock", posted Nov. 11, 2009.

"How to Resolve "Bad Super Block: Magic Number Wrong" in BSD", Free Online Articles Director Article Base, posted Sep. 5, 2009.

Micron Technology Inc., "Memory Management in NAND Flash Arrays", Technical Note, year 2005.

Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Park et al., "Sub-Grouped Superblock Management for High-Performance Flash Storages", IEICE Electronics Express, vol. 6, No. 6, pp. 297-303, Mar. 25, 2009.

U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
U.S. Appl. No. 12/388,528 Official Action dated Nov. 29, 2010.
Engineering Windows 7, "Support and Q&A for Solid-State Drives", e7blog, May 5, 2009.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 11/995,814 Official Action dated Dec. 17, 2010.
U.S. Appl. No. 12/534,898 Official Action dated Mar. 23, 2011.
U.S. Appl. No. 13/047,822 filed Mar. 15, 2011.
U.S. Appl. No. 13/069,406 filed Mar. 23, 2011.
U.S. Appl. No. 13/088,361 filed Apr. 17, 2011.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application No. 200780026181.3 Official Action dated Apr. 8, 2011.

* cited by examiner

COMMAND INTERFACE FOR MEMORY DEVICES

CROSS-REFERENCE TO RELATED APPLICATIONS

This application claims the benefit of U.S. Provisional Patent Application 60/913,281, filed Apr. 22, 2007, and U.S. Provisional Patent Application 60/917,653, filed May 12, 2007, whose disclosures are incorporated herein by reference.

FIELD OF THE INVENTION

The present invention relates generally to memory devices, and particularly to command interfaces for controlling memory devices.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Various command interfaces for controlling memory devices are known in the art. For example, U.S. Pat. No. 5,801,985, whose disclosure is incorporated herein by reference, describes a memory system capable of being configured after fabrication using control parameters stored in non-volatile data storage units. The system includes an array of memory cells, separate from the data storage units. The system also includes control circuitry for controlling memory operations, such as programming the memory cells and reading the memory cells, when the memory system is in a normal mode of operation. The non-volatile data storage units store control parameter data used by the control means for controlling the memory operations, with the control parameters being modifiable when the memory system is placed in an alternative mode of operation as opposed the normal mode of operation. Once the memory has been fabricated and characterized, the control parameters can be selected and loaded into the data storage units.

U.S. Pat. No. 6,851,018, whose disclosure is incorporated herein by reference, describes a method and system for exchanging operation parameters between a data storage device and a storage device controller. A memory device within the data storage device comprises operation parameter registers, which store operation parameters that are indicative of environmental conditions and characteristics of the memory device itself. The operation parameter registers may be readable and writable. To initiate an exchange of operation parameters, the storage device controller sends a command code indicative of an operation parameter exchange command and designates an address in the operation parameter registers to which operation parameters are to be written or from which operation parameters are to be read.

U.S. Patent Application Publications 2006/0256620 and 2007/0047326, whose disclosures are incorporated herein by reference, describe methods for programming a target memory cell of a memory device. The target memory cell is programmed by applying a programming voltage to a word line that includes the target memory cell, determining whether the target memory cell is programmed, and increasing the programming voltage by a step voltage if it is determined that the target memory cell is not programmed. An initial programming voltage and the step voltage are each selectable after fabrication of the memory device.

SUMMARY OF THE INVENTION

Embodiments of the present invention provide a method for operating a memory device that includes a plurality of analog memory cells, including:

accepting at an input of the memory device a self-contained command to perform a memory access operation on at least one of the memory cells, the command including an instruction specifying the memory access operation and one or more parameters that are indicative of analog settings to be applied to the at least one of the memory cells when performing the memory access operation; and executing the self-contained command in the memory device by extracting the parameters, applying the analog settings to the at least one of the memory cells responsively to the extracted parameters, and performing the specified memory access operation in accordance with the instruction on the at least one of the memory cells using the settings.

In some embodiments, the memory access operation includes a read operation for reading data from the at least one of the memory cells, performing the memory access operation includes reading the data by comparing storage values stored in the at least one of the memory cells to one or more read reference levels, and the one or more parameters are indicative of the one or more read reference levels to be used in reading the data. In an embodiment, the read operation specifies reading the data multiple times using multiple respective sets of the read reference levels, and the one or more parameters are indicative of the multiple sets of the read reference levels.

In another embodiment, the memory access operation includes a read operation for reading data from the at least one of the memory cells, the at least one of the memory cells belongs to a given word line of the memory device, performing the memory access operation includes applying one or more pass voltages to word lines other than the given word line, and the one or more parameters are indicative of the one or more pass voltages.

In yet another embodiment, the memory access operation includes a write operation for programming the at least one of the memory cells to store data, the self-contained command further includes the data to be stored, and performing the memory access operation includes writing storage values that represent the data to the at least one memory cell. In an embodiment, performing the memory access operation includes verifying the written storage values with respect to one or more verification reference levels, and the one or more parameters are indicative of the verification reference levels to be used in verifying the written storage values.

In a disclosed embodiment, writing the storage values includes applying to the at least one memory cell an incrementally-increasing sequence of programming pulses that start at an initial magnitude, and the one or more parameters are indicative of the initial magnitude. Additionally or alternatively, writing the storage values includes applying to the at least one memory cell a sequence of programming pulses that incrementally increases by a programming step size, and the one or more parameters are indicative of the programming step size. Further additionally or alternatively, writing the storage values includes applying to the at least one memory cell a sequence of programming pulses having a pulse width, and the one or more parameters are indicative of the pulse width.

In some embodiments, the memory access operation includes an erase operation for erasing the at least one of the memory cells. In an embodiment, erasing the at least one of the memory cells includes verifying erasure of the at least one of the memory cells with respect to one or more erase verification reference levels, and the one or more parameters are indicative of the one or more erase verification reference levels to be used in verifying the erasure. Additionally or alternatively, erasing the at least one of the memory cells includes applying an erasure voltage to the at least one of the memory cells, and the one or more parameters are indicative of the erasure voltage.

In a disclosed embodiment, the one or more parameters are discarded after applying the analog settings. In an embodiment, the one or more parameters are indicative of differences between the analog settings to be applied when performing the memory access operation and respective predefined baseline settings. In another embodiment, the memory device holds multiple predefined sets of the analog settings, the one or more parameters are indicative of one of the predefined sets that is to be applied when performing the memory access operation, and applying the analog settings includes applying the one of the predefined sets.

In yet another embodiment, the memory access operation includes a copy operation for reading data from a first group of the memory cells and writing the data into a second group of the memory cells that is different from the first group. In still another embodiment, the memory cells are arranged in multiple memory planes, and the self-contained command specifies two or more memory access operations to be performed concurrently in respective, different planes of the memory device.

There is additionally provided, in accordance with an embodiment of the present invention, a method for operating a memory device that includes a plurality of analog memory cells, including:

constructing a self-contained command to perform a memory access operation on at least one of the memory cells, the command including an instruction specifying the memory access operation and one or more parameters that are indicative of analog settings to be applied to the at least one of the memory cells when performing the memory access operation; and sending the self-contained command to the memory device so as to cause the memory device to execute the command by extracting the parameters, applying the analog settings to the at least one of the memory cells responsively to the extracted parameters and performing the specified memory access operation in accordance with the instruction on the at least one of the memory cells using the settings.

There is also provided, in accordance with an embodiment of the present invention, a memory device, including:

a plurality of analog memory cells; and control circuitry, which is coupled to accept a self-contained command for performing a memory access operation on at least one of the memory cells, the command including an instruction specifying the memory access operation and one or more parameters that are indicative of analog settings to be applied to the at least one of the memory cells when performing the memory access operation, and to execute the self-contained command by extracting the parameters, applying the analog settings to the at least one of the memory cells responsively to the extracted parameters, and performing the specified memory access operation in accordance with the instruction on the at least one of the memory cells using the settings.

There is further provided, in accordance with an embodiment of the present invention, a memory controller, including:

an interface, which is coupled to communicate with a memory device that includes a plurality of analog memory cells; and a processor, which is coupled to construct a self-contained command for performing a memory access operation on at least one of the memory cells, the command including an instruction specifying the memory access operation and one or more parameters that are indicative of analog settings to be applied to the at least one of the memory cells when performing the memory access operation, and to send the self-contained command to the memory device over the interface so as to cause the memory device to execute the command by extracting the parameters, applying the analog settings to the at least one of the memory cells responsively to the extracted parameters, and performing the specified memory access operation in accordance with the instruction on the at least one of the memory cells using the settings.

The present invention will be more fully understood from the following detailed description of the embodiments thereof, taken together with the drawings in which:

DETAILED DESCRIPTION OF EMBODIMENTS

Overview

Embodiments of the present invention provide improved methods and systems for controlling and operating memory devices. In some embodiments that are described hereinbelow, a memory device comprises multiple analog memory cells and a control unit, which stores data in the cells and reads data from the cells. A memory controller operates the memory device by sending commands to the control unit of the memory device in accordance with a predefined command interface. Each command instructs the memory to perform a certain memory access operation, such as a read, write or erase operation.

The commands sent from the memory controller to the memory device are self-contained, meaning that each command comprises the different parameters needed for its execution by the memory device. Each self-contained command comprises an op-code that specifies the requested memory access operation, and one or more parameters, which typically indicate analog settings to be applied to the memory cells when performing the operation. In the context of the present patent application and in the claims, the term "analog setting" is used to describe any suitable analog quantity that is applied to a memory cell or to a group of cells in order to perform a memory access operation. Analog settings may comprise, for example, various voltages, currents and pulse widths.

For example, the parameters of a self-contained read command may comprise read reference levels to be used for reading the data. The parameters of a self-contained write command may comprise parameters of an iterative Program and Verify (P&V) process that is used for storing the data, such as programming reference levels (also referred to as verification reference levels), an increment step size of the P&V process and/or an initial programming pulse magnitude. Other types of memory access operations, such as self-contained erase, multi-read and copy operations are also described herein.

The memory device executes the self-contained command by extracting the parameters, applying the analog settings responsively to the extracted parameters, and performing the memory access operation in accordance with the instruction.

Unlike some known methods and systems in which the memory device stores the values of the parameters used in performing memory access operations, the methods and systems described herein enable the memory device to operate without dependence on internal storage of parameter values. The memory device may execute each self-contained command using only the parameters conveyed therein, without a need to cache, track or otherwise maintain parameter values between commands. Operating in this manner simplifies the operation and hardware configuration of the memory device.

System Description

Figure 1:
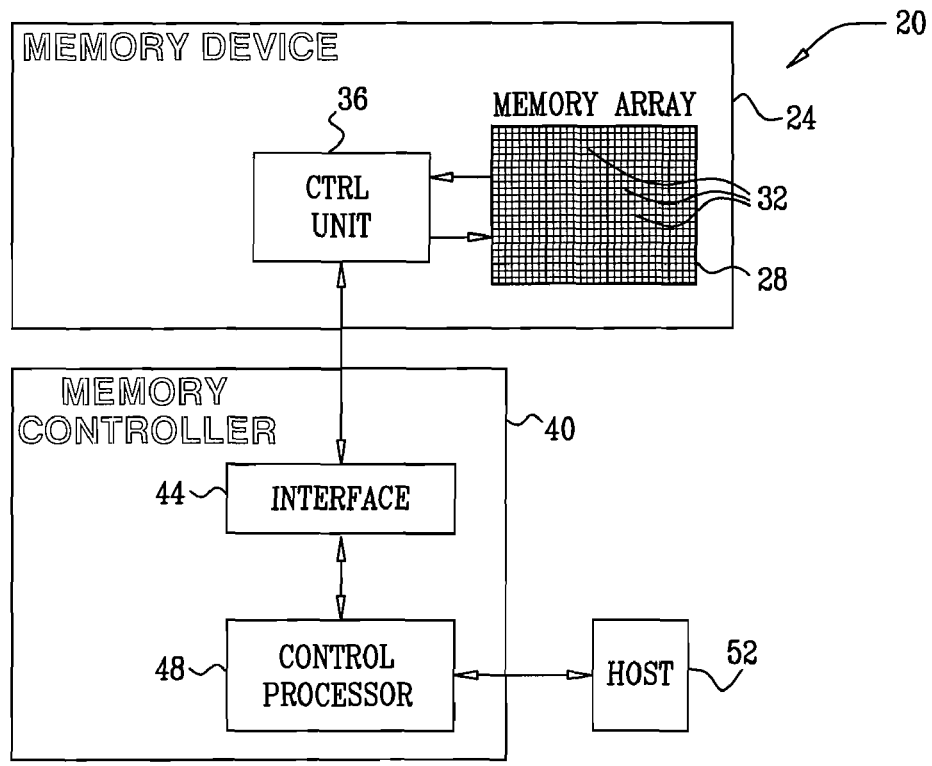
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disk (SSD) devices, digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical charge. Array 32 may comprise analog memory cells of any kind, such as, for example, NAND, NOR and CTF Flash cells, PCM, NROM, FRAM, MRAM and DRAM cells.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a control unit 36, which accepts and executes commands for performing memory access operations on memory cells 32 of array 28. Memory device 24 typically comprises a single-chip device, in which the memory array and the control unit are fabricated on the same semiconductor die. Memory access operations may comprise, for example, storing data in the memory device, reading data from the memory device and erasing a group of memory cells. The commands are formatted in accordance with a command interface, which is described in detail further below.

When storing data in the memory array, the control unit accepts the data for storage, converts the data to storage values that represent the data, and writes the storage values to memory cells 32. The data may be cached in a page buffer before it is written to the cells. In alternative embodiments, the control unit does not perform the conversion, but is provided with voltage samples, i.e., with the storage values for storage in the cells. The control unit typically programs the cells using an iterative Program and Verify (P&V) process, as is known in the art.

When reading data out of array 28, control unit 36 reads storage values from cells 32, converts the storage values into digital samples having a resolution of one or more bits, and outputs the samples. Alternatively, the control unit may output the read storage values without converting them to data.

Further alternatively, the control unit may output any other type of information related to the storage values read from the cells.

The storage and retrieval of data in and out of memory device 24 is performed by a memory controller 40. Controller 40 comprises an interface 44 for communicating with unit 36 of memory device 24, and a control processor 48, which processes the data that is written into and read from device 24. The memory controller communicates with the memory device using the command interface that is described below.

In some embodiments, memory controller 40 carries out signal processing functions such as, for example, Error Correction Coding (ECC) of the stored data, estimation and cancellation of distortion in the values read from the memory cells, and/or reading soft values from the memory cells. Such signal processing functions are described, for example, in PCT Published Application WO 2007/132457, entitled "Combined Distortion Estimation and Error Correction Coding for Memory Devices," filed May 10, 2007, in PCT Published Application WO 2007/132453, entitled "Distortion Estimation and Cancellation in Memory Devices," filed May 10, 2007, and in PCT Application PCT/IL2007/001315, entitled "Reading Memory Cells using Multiple Thresholds," filed Oct. 30, 2007, whose disclosures are incorporated herein by reference.

Memory controller 40 communicates with a host 52, for accepting data for storage in the memory device and for outputting data retrieved from the memory device. Controller 40, and in particular processor 48, may be implemented in hardware. Alternatively, controller 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, encoding and decoding circuits, addressing circuits, timing and sequencing circuits and debugging circuits, have been omitted from the figure for clarity.

In the exemplary system configuration shown in FIG. 1, memory device 24 and memory controller 40 are implemented as two separate Integrated Circuits (ICs). In alternative embodiments, however, the memory device and controller may be integrated on separate semiconductor dies in a single Multi-Chip Package (MCP) or System on Chip (SoC). Further alternatively, some or all of the memory controller circuitry may reside on the same die on which the memory array is disposed. Further alternatively, some or all of the functionality of memory controller 40 can be implemented in software and carried out by a processor or other element of the host system. In some implementations, a single memory controller 40 may control multiple memory devices 24.

Memory cells 32 of array 28 are typically arranged in a grid having multiple rows and columns. Each cell 32 typically comprises a floating gate Metal-Oxide Semiconductor (MOS) transistor. A certain amount of electrical charge can be stored in a particular cell by applying appropriate voltage or current levels to the transistor gate, source and drain. The value stored in the cell can be read by measuring the threshold voltage of the cell, which is defined as the minimal voltage that needs to be applied to the gate of the transistor in order to cause the transistor to conduct. The read threshold voltage is indicative of the charge stored in the cell.

In a typical configuration of array 28, the gates of the transistors in each row are connected by word lines, and the sources of the transistors in each column are connected by bit lines. The array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

Memoryless Command Interface

Memory controller 40 operates memory device 24 by sending commands, which instruct the memory device to perform different memory access operations. The commands sent by controller 40 are self-contained, meaning that each command is fully-specified and contains the parameters needed for its execution. Thus, the memory device may execute each self-contained command using only the parameters conveyed therein, without a need to cache, track or otherwise maintain parameter values between commands. This sort of operation, without dependence on internal storage of parameter values, considerably simplifies the operation and hardware configuration of the memory device.

Typically, each command comprises an instruction specifying the requested memory access operation, e.g., read, write or erase. Each command further comprises one or more parameters, which are indicative of respective analog settings to be used in performing the requested operation. Different memory access operations are specified in terms of different types of analog settings, which are applied to the cells by control unit 36. Analog settings that are specified by the command parameters may comprise, for example, read reference levels, program verification reference levels, erase verification reference levels, various voltages, currents or pulse widths that are used in the P&V process. Reference levels may be specified as voltages or as currents. Typically, each memory access operation is carried out in response to a single self-contained command, which includes both the instruction and the applicable parameters, and is transferred in a single instruction cycle.

Figure 2:
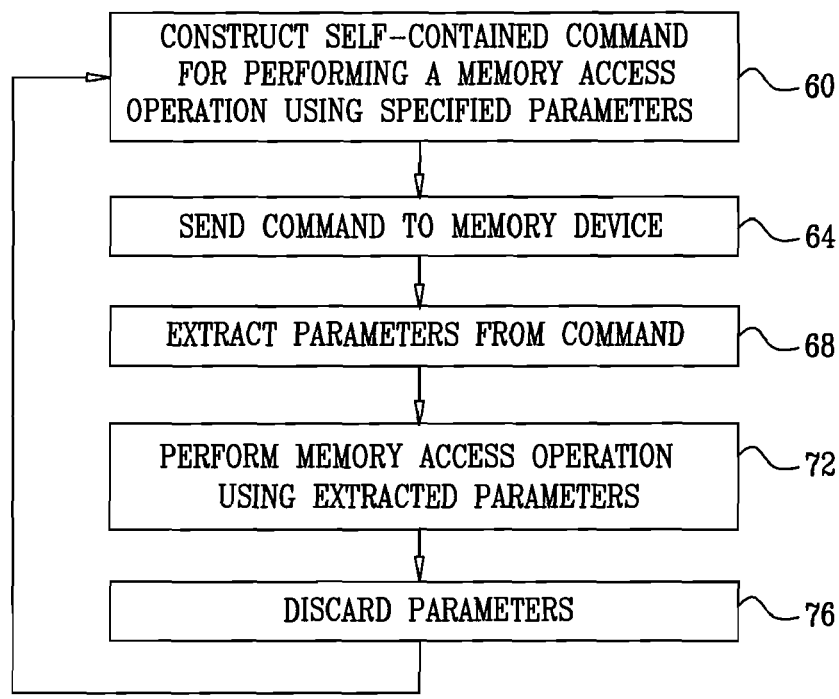
FIG. 2 is a flow chart that schematically illustrates a method for controlling a memory device, in accordance with an embodiment of the present invention.

FIG. 2 is a flow chart that schematically illustrates a method for controlling memory device 24, in accordance with an embodiment of the present invention. The method begins with processor 48 of memory controller 40 constructing a self-contained command, at a command construction step 60. In some cases, the command may be invoked by a request from host 52 to store or retrieve data. The command comprises an instruction (op-code) for performing a certain memory access operation on a specified group of cells (typically a page), and further comprises one or more parameters. The memory controller sends the command to memory device 24 using interface 44, at a sending step 64.

In device 24, control unit 36 receives the command and extracts the parameters from the received command, at a parameter extraction step 68. The control unit thus serves as an input for receiving commands by the memory device. The control unit performs the memory access operation, at an execution step 72. The control unit determines the requested operation type based on the instruction given in the command, applies the appropriate analog settings that were specified by the extracted command parameters to the memory cells in question, and performs the requested memory access operation using the specified settings. Since each command is self-contained, the control unit may then discard the command parameters, at a discarding step 76. Several exemplary commands will now be described in greater detail.

A group of memory cells is typically read by comparing the storage values of the cells to one or more read reference levels. For example, four-level cells are typically read using three read reference levels that differentiate among the four programming levels. The optimal values of the read reference levels may vary over time and/or from one cell group to another.

In some embodiments, memory controller 40 sends the memory device a self-contained read command. The read command typically comprises (1) a read instruction op-code, (2) an address of the memory cells to be read, and (3) a set of one or more read reference levels for use in performing the read operation. For N-bit memory cells, the command may comprise $2^N-1$ parameters that specify the respective read reference levels. Control unit 36 in the memory device accepts the self-contained read command, extracts the command parameters, sets the appropriate read reference levels as specified by the extracted parameters, and reads the requested group of memory cells using these reference levels. The control unit sends the read data to the memory controller.

Additionally or alternatively to specifying the read reference levels, the parameters of the self-contained read command may specify other types of analog settings. For example, in NAND Flash devices, the memory cells are often arranged in NAND strings. Each NAND string comprises a group of cells that are connected back-to-back in series with one another, with each cell in the string belonging to a different word line. In such devices, when reading a page of memory cells belonging to a certain word line, control unit 36 typically applies a high voltage (referred to as a pass voltage) to the other word lines of the string. In some embodiments, the parameters of the self-contained read command specify the pass voltage (or voltages) to be applied to the unselected word lines when performing the read operation.

As another example of a self-contained command, a group of memory cells is typically programmed by writing storage values to the cells and verifying the written storage values in an iterative Program and Verify (P&V) process. In a typical P&V process, control unit 36 applies an incrementally-increasing sequence of programming pulses to a specified group of cells, usually a page. The cell voltages are read between successive programming iterations and verified against the desired programming levels. The process continues until the cells reach their intended programming levels or until a maximum number of iterations have been performed.

In some embodiments, memory controller 40 sends a self-contained write command to memory device 24. The write commands comprises (1) a write instruction op-code, (2) an address of the memory cells to be programmed, (3) the data to be written to the cells, and (4) a set of parameters indicative of analog settings to be used in the P&V operation. The command parameters may specify, for example, programming reference levels (also referred to as verification reference levels) against which the programmed values are to be verified. Additionally or alternatively, the command parameters may specify other settings of the iterative P&V process, such as an initial voltage magnitude of the first programming iteration, an increment step size (i.e., a voltage difference between successive programming pulses), and/or a pulse width of the programming pulses. In these embodiments, control unit 36 accepts the self-contained write command, extracts the parameters from the command, applies the appropriate analog settings as specified by the extracted parameters, and programs the specified memory cells with the specified data using the settings.

As yet another example, memory cells are typically erased by applying erase voltages (usually high negative voltages) to the cells. In some embodiments, the memory controller may send the memory device a self-contained erase command requesting erasure of a certain group of memory cells. The group typically comprises an erasure block, which includes multiple memory pages. The self-contained erase command comprises (1) an erase instruction op-code, (2) an address of the memory block to be erased, and (3) one or more parameters that indicate analog settings to be used in the erase operation.

The command parameters may specify, for example, the erase voltages that are to be applied to the cells. Additionally or alternatively, the parameters may specify erase verification reference levels, for use in verifying that the cells are erased sufficiently and/or not over-erased. The command parameters may specify different settings for different pages in the erased block. In these embodiments, control unit 36 extracts the parameters from the self-contained erase command, and erases the requested group of cells using the settings specified by the command parameters.

As explained above, control unit 36 may read data from a group of cells by performing multiple read operations on the cells with different read reference levels. The multiple read operations are used, for example, for interference cancellation and/or for producing soft decoding metrics. In some embodiments, memory controller 40 sends the memory device a self-contained "multi-read" command, which requests that a certain group of cells be read using multiple sets of read reference levels. The command specifies the multiple sets of read reference levels to be used. Each self-contained multi-read command comprises (1) a multi-read instruction op-code, (2) an address of the cells to be read, and (3) parameters that specify the multiple sets of read reference levels.

In some embodiments, the parameters of the multi-read command may specify only one set of read reference levels explicitly, and specify the other sets in relative terms with respect to the first set. This representation method conveys the same information regarding the multiple sets of reference levels, but in a more compact form. For example, the command parameters may specify a certain set of read reference levels explicitly, and request that the cells be read K times, such that each reference level set is shifted with respect to the specified set by a given voltage shift. Alternatively, any other suitable method for specifying the multiple sets of read reference levels can also be used.

Another type of command that may be used by the memory controller to the memory device is a self-contained copyback command, which instructs the memory device to read a certain page into its internal page buffer, without sending the read data to the memory controller. A copyback command is usually followed by a write command that instructs the memory device to write the data stored in the page buffer to a different location. The parameters of a self-contained copyback command are typically similar to the parameters of a read command. A copyback command is thus regarded herein as a type of read command.

In some embodiments, the memory controller and memory device may support a self-contained copy command, which instructs the memory device to copy the data stored in a given address to another address. The self-contained copy command typically comprises (1) a copy instruction op-code, (2) an address of the memory cells to be read, (3) a set of parameters for use in reading the data, (4) an address of the memory cells in which the data is to be programmed, and (5) a set of parameters for use in writing the data.

Some memory devices operate multiple page buffers in parallel, in order to increase the reading and/or programming speed. For example, the device may read data from a certain memory page into one of the buffers, and in parallel send the data stored in another buffer to the memory controller. This operation is sometimes referred to as read cache operation. Additionally or alternatively, the device may accept data for storage in a certain page from the memory controller and store it in one buffer, and in parallel write the data already stored in another buffer into another memory page. This operation is sometimes referred to as program cache operation. In some embodiments, the self-contained read and/or write command may support read cache and/or program cache operation. For example, the self-contained read command may instruct the memory device to read a specified page using a specified set of parameters into one buffer, and in parallel to send the previously-read page (which is stored in another buffer) to the memory controller.

In any of the self-contained commands described above, the command parameters may represent the analog settings using different conventions, to achieve different value ranges and resolution levels. For example, a certain parameter may comprise an eight-bit value (00h-FFh) that represents a voltage in the range 0-12.75V at a resolution of 50 mV. An eight-bit parameter may alternatively represent a voltage in the range 0-5.1V in increments of 20 mV. Further alternatively, other suitable representation conventions, increments and ranges can also be used. Command parameters may represent positive voltages or currents, negative voltages or currents, or both. Different parameters may have different ranges, resolutions and/or representation conventions. The mapping between a parameter value and the analog setting it represents may be linear, logarithmic or in accordance with any other suitable mapping.

The command parameters may specify the values of the requested voltages explicitly, in absolute terms. In an alternative embodiment, a certain baseline set of voltage values may be known a-priori to the memory controller and to the memory device. In these embodiments, the parameters of the self-contained command may specify relative shifts of the requested voltage levels with respect to the baseline set. Further alternatively, multiple sets of parameters may be stored a-priori in the memory device, and the parameters may specify an index or other value that selects one of the predetermined parameter sets. When the parameters specify a set of reference levels, the reference level values may be expressed explicitly. Alternatively, one of the reference levels (referred to as a baseline reference level) may be specified in absolute terms, and the other reference levels may be expressed as offsets with respect to the baseline reference level.

In some embodiments, the memory cells comprise multi-level cells, each storing multiple data bits. Data belonging to different memory pages may be stored in different bits of the memory cells. For a given group of cells, each bit is typically read using a different set of read reference levels. For example, in a four level cell, one of the bits is typically read using a single read reference level, and the other bit is read using a separate set of two different read reference levels. Programming of different bits is also usually carried out using different sets of programming reference levels. In these embodiments, the parameters of a self-contained command for accessing (reading or programming) a certain page may specify only the reference levels that are applicable to the particular bit to be read. Alternatively, the self-contained command may comprise parameters that specify the full set of reference levels that are applicable to all of the bits.

As noted above, the self-contained commands typically specify an address of the cells to be accessed. In some memory devices, memory cells in a given word line (row) of the memory cell array may store data of different memory pages, in accordance with a certain mapping of pages to word lines. In some embodiments, the address specified in the self-contained command specifies the physical location of the cells to be accessed (e.g., word line number). In alternative embodiments, the address in the command specifies a logical address (e.g., page number), and the mapping of logical to physical addresses (e.g., page number to word line number) is carried out by the control unit of the memory device.

Figure 3:
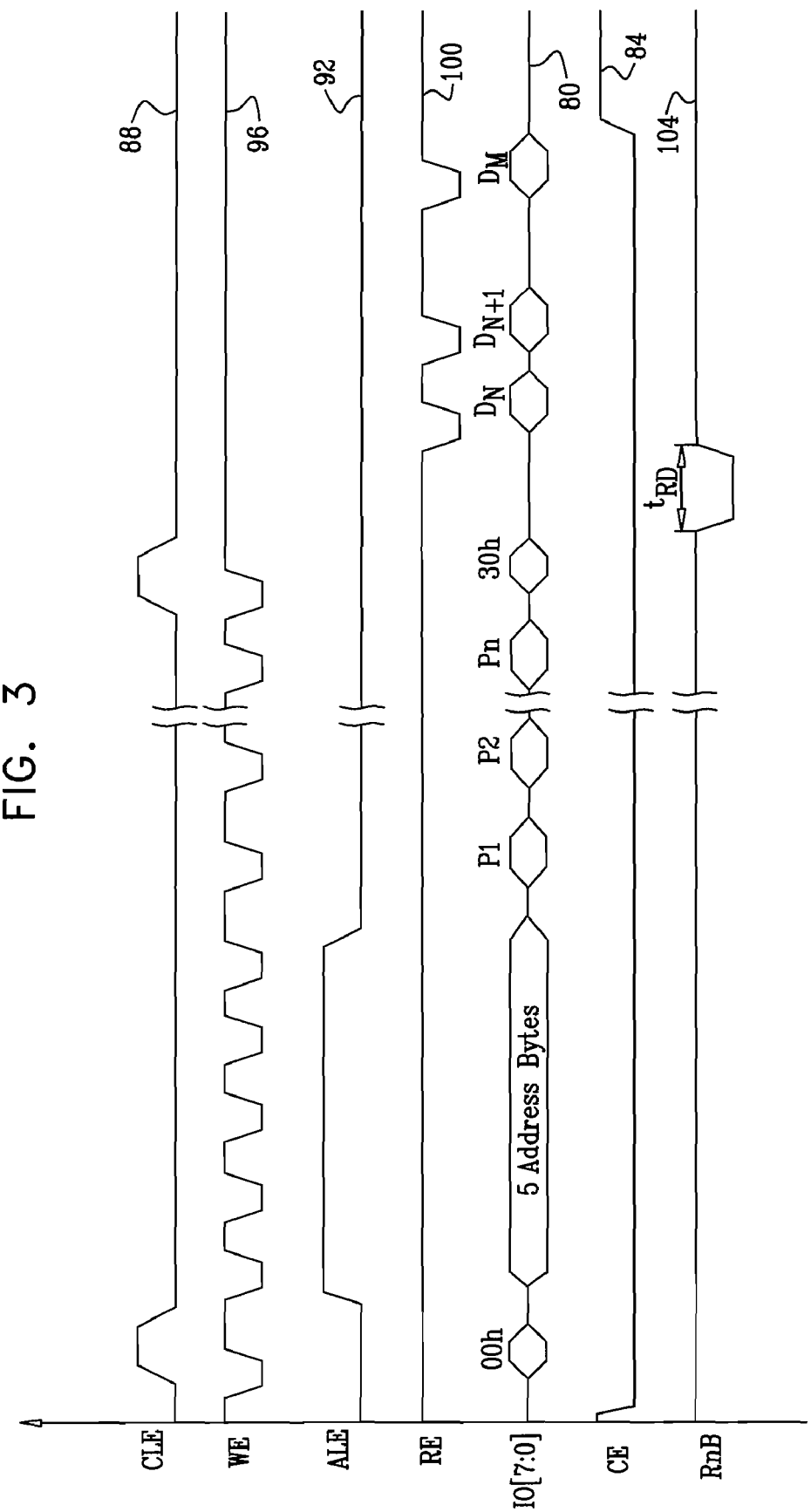
FIG. 3 is a timing diagram that schematically illustrates a self-contained command, in accordance with an embodiment of the present invention.

FIG. 3 is an exemplary timing diagram that schematically illustrates a self-contained command, in accordance with an embodiment of the present invention. The example of FIG. 3 shows a self-contained read command. In the present example, memory controller 40 and memory device 24 are assumed to communicate over an interface, which comprises an eight-bit Input-Output (IO) bus and several control signals. The control signals comprise a Command Latch Enable (CLE) signal, a Write Enable (WE) signal, an Address Latch Enable (ALE) signal, a Read Enable (RE) signal, a Chip Enable (CE) signal and a Ready not Busy (RnB) signal.

A signal 80 shows the operation of the IO bus, and demonstrates the general structure of the self-contained read command. The command begins with the memory controller sending a read instruction op-code, in the present example a 00h value, to the memory device. The op-code is followed by five bytes that contain the address of the memory page to be read. The address is followed by n bytes denoted P1 ... Pn that contain the command parameters. The command ends with a 30h op-code, which instructs the memory device to initiate execution of the command. After executing the read command, the memory device sends the read data to the memory controller over the IO bus in data bytes denoted $D_N, D_{N+1} \ldots D_M$.

A signal 84 shows the operation of the CE signal. The CE signal is enabled (pulled low) by the memory controller during the command and during the response from the memory device. In some devices, the CE signal may be undefined during certain periods of time. Signals 88 and 92 show the operation of the CLE and ALE signals, respectively. A high CLE signal indicates that the information on the IO bus comprises a command. A high ALE signal indicates that the information on the IO bus comprises an address. When both CLE and ALE signals are low, the information on the IO bus comprises data. In the example of FIG. 3, the CLE and ALE signals are both low when parameters P1 ... Pn are sent, i.e., the parameters are marked as data. Alternatively, the parameters may be marked as address, i.e., by a high ALE signal.

A signal 96 shows the operation of the WE signal, which instructs the memory device to read information from the IO bus. A signal 100 shows the operation of the RE signal, which instructs the memory device to place information on the IO bus. A signal 104 shows the operation of the RnB signal, using which the memory device indicates that it is ready to accept a subsequent command.

Although FIG. 3 shows a read command, this command was chosen purely for the sake of conceptual clarity. The general structure and signal scheme shown in the figure can be used to implement other types of self-contained commands, such as multi-read, write and erase commands. Alternatively, any other suitable type of interfaces and signal schemes can also be used.

Although the embodiments described herein mainly refer to self-contained read, write and erase commands, the principles of the present invention can also be used to define various sorts of self-contained commands for performing other types of memory access operations in a memoryless manner. For example, the memory controller and memory device may support a One Time Programming (OTP) command. The OTP command is similar to a write command, with the exception that each page can only be programmed once. A write (or OTP) command to a page that was already programmed using an OTP command will be declined by the memory device. In the present context, an OTP command is regarded as a type of write command.

In some embodiments, a self-contained command may aggregate multiple memory access operations that are to be executed concurrently. For example, when the memory device comprises multiple memory planes, a single self-contained command may specify two or more memory access operations to be executed concurrently, in different planes.

Although the embodiments described herein mainly address writing and reading data in solid-state memory devices, the principles of the present invention can also be used for programming and reading other types of storage devices, such as Hard Disk Drives (HDD).

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for operating a memory device that includes a plurality of analog memory cells, comprising:
    accepting at an input of the memory device a self-contained command to perform a memory access operation on a group of the memory cells that is used for storing data on behalf of a host, the command comprising an instruction specifying the memory access operation to be performed on the group and one or more parameters that are indicative of analog settings to be applied to the group of the memory cells on which the memory access operation is to be performed; and
    executing the self-contained command in the memory device by extracting the parameters, applying the analog settings to the group of the memory cells responsively to the extracted parameters, and performing the specified memory access operation in accordance with the instruction on the group of the memory cells using the settings.

2. The method according to claim 1, wherein the memory access operation comprises a read operation for reading data from the group of the memory cells, wherein performing the memory access operation comprises reading the data by comparing storage values stored in the group of the memory cells to one or more read reference levels, and wherein the one or more parameters are indicative of the one or more read reference levels to be used in reading the data.

3. The method according to claim 2, wherein the read operation specifies reading the data multiple times using multiple respective sets of the read reference levels, and wherein the one or more parameters are indicative of the multiple sets of the read reference levels.

4. The method according to claim 1, wherein the memory access operation comprises a read operation for reading data from the group of the memory cells, wherein the group of the memory cells belongs to a given word line of the memory device, wherein performing the memory access operation comprises applying one or more pass voltages to word lines other than the given word line, and wherein the one or more parameters are indicative of the one or more pass voltages.

5. The method according to claim 1, wherein the memory access operation comprises a write operation for programming the group of the memory cells to store data, wherein the self-contained command further comprises the data to be stored, and wherein performing the memory access operation comprises writing storage values that represent the data to the group of the memory cells.

6. The method according to claim 5, wherein performing the memory access operation comprises verifying the written storage values with respect to one or more verification reference levels, and wherein the one or more parameters are indicative of the verification reference levels to be used in verifying the written storage values.

7. The method according to claim 5, wherein writing the storage values comprises applying to the group of the memory cells an incrementally-increasing sequence of programming pulses that start at an initial magnitude, and wherein the one or more parameters are indicative of the initial magnitude.

8. The method according to claim 5, wherein writing the storage values comprises applying to the group of the memory cells a sequence of programming pulses that incrementally increases by a programming step size, and wherein the one or more parameters are indicative of the programming step size.

9. The method according to claim 5, wherein writing the storage values comprises applying to the group of the memory cells a sequence of programming pulses having a pulse width, and wherein the one or more parameters are indicative of the pulse width.

10. The method according to claim 1, wherein the memory access operation comprises an erase operation for erasing the group of the memory cells.

11. The method according to claim 10, wherein erasing the group of the memory cells comprises verifying erasure of the group of the memory cells with respect to one or more erase verification reference levels, and wherein the one or more parameters are indicative of the one or more erase verification reference levels to be used in verifying the erasure.

12. The method according to claim 10, wherein erasing the group of the memory cells comprises applying an erasure voltage to the group of the memory cells, and wherein the one or more parameters are indicative of the erasure voltage.

13. The method according to claim 1, and comprising discarding the one or more parameters after applying the analog settings.

14. The method according to claim 1, wherein the one or more parameters are indicative of differences between the analog settings to be applied when performing the memory access operation and respective predefined baseline settings.

15. The method according to claim 1, wherein the memory device holds multiple predefined sets of the analog settings, wherein the one or more parameters are indicative of one of the predefined sets that is to be applied when performing the memory access operation, and wherein applying the analog settings comprises applying the one of the predefined sets.

16. The method according to claim 1, wherein the memory access operation comprises a copy operation for reading data from a first group of the memory cells and writing the data into a second group of the memory cells that is different from the first group.

17. The method according to claim 1, wherein the memory cells are arranged in multiple memory planes, and wherein the self-contained command specifies two or more memory access operations to be performed concurrently in respective, different planes of the memory device.

18. A method for operating a memory device that includes a plurality of analog memory cells, comprising:
constructing a self-contained command to perform a memory access operation on a group of the memory cells that is used for storing data on behalf of a host, the command comprising an instruction specifying the memory access operation to be performed on the group and one or more parameters that are indicative of analog settings to be applied to the group of the memory cells on which the memory access operation is to be performed; and
sending the self-contained command to the memory device so as to cause the memory device to execute the command by extracting the parameters, applying the analog settings to the group of the memory cells responsively to the extracted parameters and performing the specified memory access operation in accordance with the instruction on the group of the memory cells using the settings.

19. A memory device, comprising:
a plurality of analog memory cells; and
control circuitry, which is coupled to accept a self-contained command for performing a memory access operation on a group of the memory cells that is used for storing data on behalf of a host, the command comprising an instruction specifying the memory access operation to be performed on the group and one or more parameters that are indicative of analog settings to be applied to the group of the memory cells on which the memory access operation is to be performed, and to execute the self-contained command by extracting the parameters, applying the analog settings to the group of the memory cells responsively to the extracted parameters, and performing the specified memory access operation in accordance with the instruction on the group of the memory cells using the settings.

20. The memory device according to claim 19, wherein the memory access operation comprises a read operation for reading data from the group of the memory cells, wherein the control circuitry is coupled to read the data by comparing storage values stored in the group of the memory cells to one or more read reference levels, and wherein the one or more parameters are indicative of the one or more read reference levels to be used in reading the data.

21. The memory device according to claim 20, wherein the read operation specifies multiple sets of the read reference levels, wherein the one or more parameters are indicative of the multiple sets of the read reference levels, and wherein the control circuitry is coupled to read the data multiple times responsively to the self-contained command using the respective multiple sets of the read reference levels.

22. The memory device according to claim 19, wherein the memory access operation comprises a read operation for reading data from the group of the memory cells, wherein the group of the memory cells belongs to a given word line of the memory device, wherein the control circuitry is coupled to apply one or more pass voltages to word lines other than the given word line when performing the read operation, and wherein the one or more parameters are indicative of the one or more pass voltages.

23. The memory device according to claim 19, wherein the memory access operation comprises a write operation for programming the group of the memory cells to store data, wherein the self-contained command further comprises the data to be stored, and wherein the control circuitry is coupled to perform the memory access operation by writing storage values that represent the data to the group of the memory cells.

24. The memory device according to claim 23, wherein the control circuitry is coupled to verify the written storage values with respect to one or more verification reference levels, and wherein the one or more parameters are indicative of the verification reference levels to be used in verifying the written storage values.

25. The memory device according to claim 23, wherein the control circuitry is coupled to write the storage values by applying to the group of the memory cells an incrementally-increasing sequence of programming pulses that start at an initial magnitude, and wherein the one or more parameters are indicative of the initial magnitude.

26. The memory device according to claim 23, wherein the control circuitry is coupled to write the storage values by applying to the group of the memory cells a sequence of programming pulses that incrementally increases by a programming step size, and wherein the one or more parameters are indicative of the programming step size.

27. The memory device according to claim 23, wherein the control circuitry is coupled to write the storage values by applying to the group of the memory cells a sequence of programming pulses having a pulse width, and wherein the one or more parameters are indicative of the pulse width.

28. The memory device according to claim 19, wherein the memory access operation comprises an erase operation for erasing the group of the memory cells.

29. The memory device according to claim 28, wherein the control circuitry is coupled to verify erasure of the group of the memory cells with respect to one or more erase verification reference levels, and wherein the one or more parameters are indicative of the one or more erase verification reference levels to be used in verifying the erasure.

30. The memory device according to claim 28, wherein the control circuitry is coupled to erase the group of the memory cells by applying an erasure voltage to the group of the memory cells, and wherein the one or more parameters are indicative of the erasure voltage.

31. The memory device according to claim 19, wherein the control circuitry is coupled to discard the one or more parameters after applying the analog settings.

32. The memory device according to claim 19, wherein the one or more parameters are indicative of differences between the analog settings to be applied when performing the memory access operation and respective predefined baseline settings.

33. The memory device according to claim 19, wherein the memory device holds multiple predefined sets of the analog settings, wherein the one or more parameters are indicative of one of the predefined sets that is to be applied when performing the memory access operation, and wherein the control circuitry is coupled to apply the one of the predefined sets.

34. The memory device according to claim 19, wherein the memory access operation comprises a copy operation for reading data from a first group of the memory cells and writing the data into a second group of the memory cells that is different from the first group.

35. The memory device according to claim 19, wherein the memory cells are arranged in multiple memory planes, and wherein the self-contained command specifies two or more memory access operations to be performed concurrently in respective, different planes of the memory device.

36. A memory controller, comprising:

an interface, which is coupled to communicate with a memory device that includes a plurality of analog memory cells; and a processor, which is coupled to construct a self-contained command for performing a memory access operation on a group of the memory cells that is used for storing data on behalf of a host, the command comprising an instruction specifying the memory access operation to be performed on the group and one or more parameters that are indicative of analog settings to be applied to the group of the memory cells on which the memory access operation is to be performed, and to send the self-contained command to the memory device over the interface so as to cause the memory device to execute the command by extracting the parameters, applying the analog settings to the group of the memory cells responsively to the extracted parameters, and performing the specified memory access operation in accordance with the instruction on the group of the memory cells using the settings.

* * * * *